FREQUENCY SYNTHESIZER

Filed Aug. 6, 1959 2 Sheets-Sheet 1

INVENTOR
WERNER BRACK
ATTORNEY

INVENTOR
WERNER BRACK

BY [signature]

ATTORNEY

United States Patent Office 3,017,579 Patented Jan. 16, 1962

3,017,579

FREQUENCY SYNTHESIZER

Werner Brack, Roslyn Heights, N.Y., assignor to Radio Engineering Laboratories, Inc., Long Island City, N.Y., a corporation of New York Filed Aug. 6, 1959, Ser. No. 832,069
8 Claims. (Cl. 331—38)

This invention relates generally to oscillation generators and more particularly to an arrangement for synthesizing a particular frequency with a high order of accuracy at any selected point over a relatively wide band of frequencies.

Frequency synthesizers have been known for providing a selected frequency over a band of frequencies in which the selected frequency is accurately determined by a combination of oscillations from individual sources which are combined to produce a composite or synthesized output frequency. The general arrangement of synthesizers for this purpose generally comprises arrangements for heterodyning the frequencies from the various sources to obtain the sum and difference frequencies of the sources. With this arrangement the final output frequency can be composed of the sum of frequencies from separate generators each of which supplies a digit in the digital designation of the precise output frequency.

Synthesizers of precise individual frequencies have become an important component in single side band communication equipment as presently employed for global communication networks. This application of the frequency synthesizer has resulted in the requirement of an extremely stable output frequency which can be varied over a relatively wide band of frequencies in which the stability and frequency adjustment are achieved with a minimum amount of equipment and in which the entire synthesizer is suitable for incorporation in communications equipment which is installed in mobile craft. Accordingly, considerations of economy and minimum weight become desirable if their achievement is possible without degrading the usefulness of the output frequency signal. Since single side band service requires that two oscillators located at the points between which communication is to be established must oscillate at precisely the same frequency and since these points may be many miles apart and no direct means of synchronization is available between the widely spaced communication points it is essential that the stability of the oscillators at each location be extremely good and that the oscillators are capable of adjustment to the corresponding frequency. This result has only been approximately achieved in the prior art frequency synthesizers since the output frequencies that have been provided are as stable as the frequencies generated by the crystal oscillator sources used to synthesize the frequency and in general the least significant digit in the selected frequency will represent a small increment of frequency variation as the best resolution available from the synthesizer. Where continuous tuning is desired between the steps of the smallest increment of adjustment an interpolation oscillator has generally been provided in the form of a variable frequency tuned oscillator which is, as is well known, less stable than the crystal controlled oscillators which contribute the major frequency components of the synthesizer.

It is an object of the present invention to overcome the disadvantages of prior art synthesizers and to provide a new and improved frequency synthesizer.

Another object of this invention is to provide a frequency synthesizer which is simple and economical, light in weight and provides an output which is completely derived from crystal stabilized oscillators.

A further object of this invention is to provide a continuously adjustable frequency synthesizer in which a continuously adjustable output frequency achieves crystal oscillator stability.

Another object of this invention is to provide a synthesized frequency of six significant figures which is continuously adjustable with crystal stability in the least significant figures.

A further object of the invention is to provide a synthesizer having differentially deviated crystal controlled oscillators for producing the least significant figure in the synthesizer output.

A still further object of the invention is to provide a synthesizer employing a regenerative frequency divider which is phase stable and insensitive to load.

Other objects of the invention include the provision of novel circuits which combine to produce a highly stable continuously adjustable output frequency which is accurate to within a few cycles of the setting anywhere in the region of the order of tens of megacycles with a minimum amount of equipment.

These and other objects of the invention will be apparent from the following detailed description taken in conjunction with the accompanying drawing wherein.

Figures 1, 2:
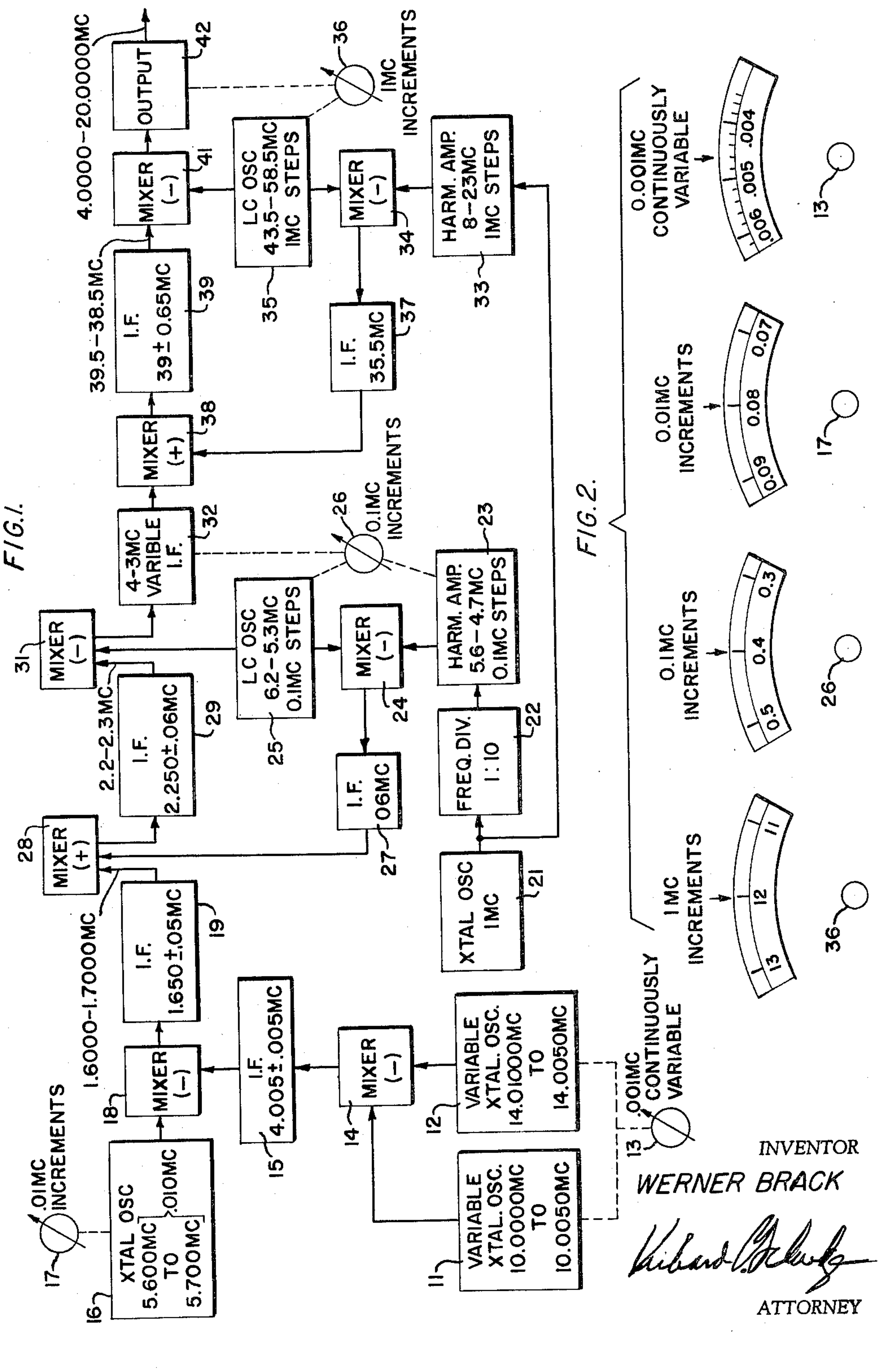
FIG. 1 is a block diagram of the synthesizer in accordance with the present invention.
FIG. 2 is a representation of a dial indicator with a typical dial setting for the apparatus of FIG. 1.

Referring now to FIG. 1 a system for producing an output frequency continuously variable over the range from 4 to 20 megacycles (mc.) is shown which can be adjusted for any frequency within this range. Four basic crystal stabilized oscillators are employed. The output of these oscillators is sufficiently stable to permit the synthesizer to be adjusted to any frequency within the range of 4 to 20 megacycles with an adjustment resolution of 200 cycles which can be interpolated to within 50 cycles and the resulting error in the output frequency for such setting will be within 50 cycles of the adjusted setting. Accuracies of this order are derived from a pair of crystal oscillators 11, 12 which are deviated by capacitance variation across the crystals in a manner which will be more fully described with reference to FIG. 3. The deviation of oscillators 11, 12 is selectively accomplished with a single control 13 which deviates the oscillators from their median frequencies in opposite directions such that as one oscillator increases in frequency the other oscillator decreases in frequency and vice versa. With this arrangement the difference frequency between the oscillators 11 and 12 will be twice the deviation of either oscillator taken individually.

A continuously variable frequency of crystal oscillator stability is obtained by beating the outputs of oscillators 11, 12 in a mixer 14 and taking the difference frequency output from the mixer 14. As indicated, oscillator 11 may provide a variation from 10 to 10.0050 mc. while oscillator 12 may provide a variation from 14.0100 to 14.0050 mc. The action of mixer 14 produces the difference frequency between the deviation ranges of oscillators 11, 12 and thus produces at the output of an IF amplifier 15 a signal which is continuously variable over the range from 4.0000 to 4.0100 mc. The variation at the output of IF amplifier 15 contributes continuously adjustable frequency between one-thousandth mc. increments under the control of adjustment 13 in the final output of the synthesizer.

A third crystal oscillator 16 is provided with 10 crystal controlled discrete frequencies ranging from 5.610 to 5.700 mc. and adjustable in 10 steps separated by 0.010 mc. The adjustment of oscillator 16 is under control of a manually operable selector 17 with which any one of the 10 discrete frequencies of oscillator 16 may be selected.

The difference frequency between the outputs of the IF amplifier 15 and oscillator 16 is obtained in a mixer 18 and applied to an IF amplifier 19 which produces at its output a signal continuously variable in response to the operation of controls 13, 17 over the range 1.6000 to 1.7000 mc. This signal at the output of amplifier 19 provides the one-hundredth mc. component to the ultimate output of the synthesizer from the oscillator 16 under control of the control 17 in combination with the output selected by control 13.

The tens units and one-tenth megacycle components in the output of the synthesizer are obtained from a combination now to be described which produces these frequency components with the stability of a single crystal oscillator 21 which is sufficiently stable not to introduce error in the less significant digits established by controls 13, 17. The one-tenth mc. increments of the synthesizer are derived from the 1 mc. output of crystal oscillator 21 by dividing the crystal stabilized output of oscillator 21 into a 0.1 mc. frequency. The 0.1 mc. signal is available at the output of a frequency divider 22 which will be described in detail in connection with FIG. 4. The 0.1 mc. output of the divider 22 is applied to a harmonic amplifier 23 which is adjustable to select the 56th through the 47th harmonic of the 0.1 mc. input and supplies the selected output in this range to a mixer 24. A conventional L—C oscillator 25 tunable over the range from 6.2 to 5.3 mc. in 0.1 mc. steps supplies a second input to the mixer 24. The oscillator 25 may be any conventional oscillator and its operation in the circuit of the present invention is such that the stability thereof is not effective in determining the stability of the final output of the synthesizer. The 0.1 mc. steps of the oscillator 25 and the harmonic amplifier 23 are selected by a common control 26 in pairs to produce a constant 0.6 mc. output to an IF amplifier 27. The output of amplifier 27 is applied to a mixer 28 where it is mixed with the output of amplifier 19 to produce a signal between 2.2 and 2.3 mc. for amplification in an amplifier 29.

The output of the amplifier 29 is continuously adjustable over the range from 2.2000 to 2.3000 mc. and is accurate but for the inaccuracy and instability introduced therein by the oscillator 25. In a mixer 31 the output of amplifier 29 is again heterodyned with the frequency generated by the oscillator 25 and any inaccuracies in the setting of oscillator 25 or instability therein which is introduced in the signal applied to mixer 28 is cancelled by the mixing action in mixer 31 with the result that the signal output of mixer 31 provides a stable, accurate signal continuously tunable over the range 4.0000 to 3.0000 mc. This signal is amplified in a narrow band adjustable IF amplifier 32. The amplifier 32 is tuned to the particular frequency resulting from the setting of control 26 by a gang tuning connection therewith.

The tens and units megacycle components of the synthesizer are obtained with the accuracy and stability of crystal oscillator 21 by applying the one megacycle output thereof to a harmonic amplifier 33 which is broadly tuned to produce the 8 to 23 mc. harmonics of the input signal in the output thereof and these frequency components are applied to a mixer 34. The mixer 34 has a second input signal supplied thereto from an oscillator 35 which may be a conventional LC oscillator tunable over the range from 43.5 to 58.5 mc. in one megacycle steps. The tuning of the oscillator 35 is accomplished by means of control 36 and the selected steps in the tuning range combined with the appropriate component from the harmonic amplifier 33 in the mixer 34 to produce an IF frequency of 35.5 mc. which is amplified in an IF amplifier 37. The 35.5 mc. signal from the amplifier 37 is applied to a mixer 38 and heterodyned with the signal coming from the amplifier 32. The sum frequency obtained from the output of the mixer 38 is applied to an IF amplifier 39 which provides at the output thereof a continuously variable signal over the range from 39.5 to 38.5 mc. This signal is applied to the input of a mixer 41 which has as its second input the signal generated by the oscillator 35 to produce in the output of mixer 41 a difference frequency over the range of 4 to 20 mc. Since the output of the IF amplifier 39 contains the error and instability in frequency which were introduced by the oscillator 35 in the mixer 38 the difference frequency obtained from the mixer 41 cancels such errors and instability and the output of the mixer 41 again has the accuracy of the original crystal oscillators and is accurate to the 4th decimal place. This signal is selectively applied through an amplifier 42 which is tuned in gang relation with the control 36 to produce in the final output of the synthesizer a signal of 4.0000 to 20.0000 mc. continuously adjustable and settable within 50 cycles of any desired frequency in the range with an accuracy at that setting of ±50 cycles.

FIG. 2 shows a typical dial arrangement indicating the values set by manual controls 13, 17, 26 and 36. Controls 17, 26 and 36 are step type increments as hereinbefore described and are arranged to set the numbers on the corresponding dials at the index marks opposite the numerals on the dial. The control 13 is a continuous control and the dial can correspondingly be set to any desired value including values intermediate numerals on the dial. For the dial setting shown in FIG. 2 the output frequency of the synthesizer would be 12.48460 megacycles and the actual output frequency would be within ±50 cycles of this setting.

Figure 3:
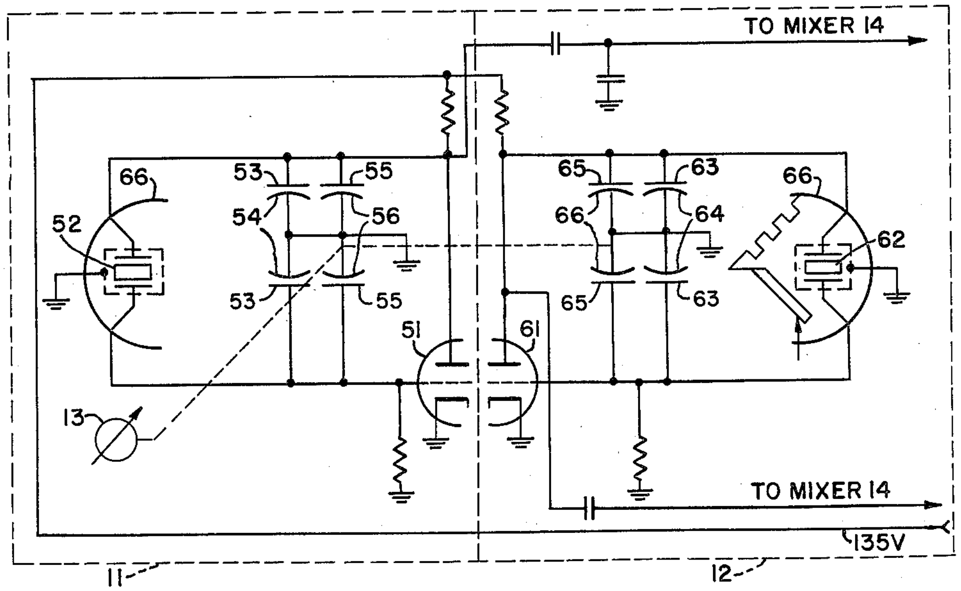
FIG. 3 is a schematic diagram of differentially deviated crystal controlled oscillators as employed to obtain continuous frequency variation with crystal stability.
Figure 4:
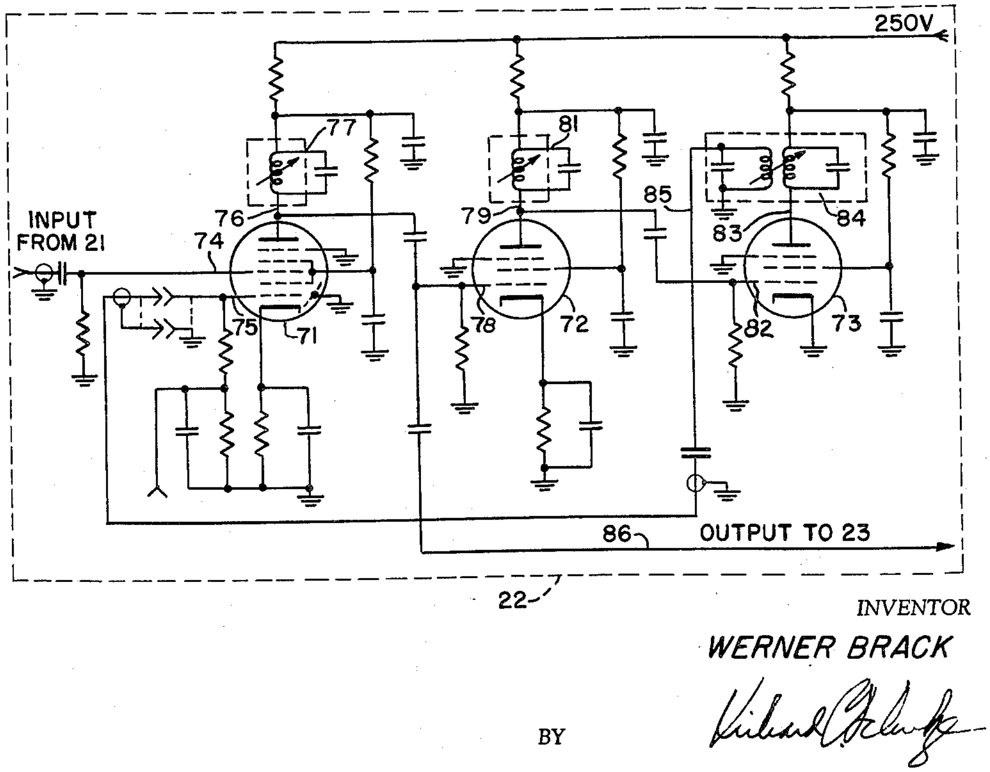
FIG. 4 is a schematic diagram of a regenerative frequency divider providing phase stable sub-harmonic frequency components in accordance with the invention.

The individual circuits employed for the indicated functions in FIG. 1 may comprise those generally known in the art but particular advantages in the system as disclosed accrue from novel combination component circuits as shown in FIGS. 3 and 4.

Referring now to FIG. 3 a schematic wiring diagram of differentially deviated oscillators 11 and 12 is shown. The oscillator 11 comprises a triode amplifier 51 connected with a piezo electric crystal 52 for crystal stabilized oscillation at the natural frequency of the crystal 52. Connected directly across the crystal 52 is a split stator trimming capacitor 53 which is adjustable by rotor 54 to vary the total capacitance across the crystal 52 without changing the capacitance ratio with respect to the grounded rotor 54. A deviation tuning capacitor has split stators 55 and a rotor 56 for providing adjustment of the capacitance across the crystal 52 selectively from the manual control 13.

The oscillator 12 is similar to oscillator 11 and comprises a triode amplifier tube 61, a piezoelectric crystal 62, a split stator trimmer capacitor 63 and a split stator tuning capacitor 65. The capacitors 63, 65, have butterfly type rotors 64, 66 which are grounded. The rotor 66 is ganged with rotor 56 but mechanically phased at 90° to provide an inverse capacitance variation between the capacitors 55, 65. Thus, when capacitor 55 has a maximum capacitance value in the two halves of the split stator with respect to ground the capacitor 65 will have a minimum capacity from stators 65 to ground. As the control 13 is rotated the capacitance from stators 55 to ground will decrease while the capacitance from stators 65 to ground will increase until capacitor 65 is a maximum and capacitor 55 is a minimum. Accordingly, the deviation in frequencies of the oscillators 11, 12 is in the opposite direction, one frequency increasing while the other frequency decreases and vice versa.

The crystals 52, 62 are selected to have common characteristics and a slightly different natural frequency of oscillation. Thus in the particular embodiment disclosed crystal 52 normally oscillates at ten megacycles with capacitor 55 at a maximum capacitance setting and crystal 62 oscillates at 14.010 megacycles at a minimum setting for capacitor 65. The crystals 52, 62 are enclosed in the same temperature regulated enclosure 66 and the two crystals are thus subject to the same environment. The crystals 52, 62 being selected for similar characteristics will thus have the same drift characteristics and temperature variation characteristics so that the difference between such variation and drift remain substantially zero.

The oscillators 11, 12 are constructed of substantially identical components and operate under substantially identical environmental and electrical conditions to further maintain identical deviation characteristics resulting from the operating influences on the oscillators. Since the difference of the frequencies of oscillators 11, 12 is obtained in the mixer 14 the maintenance of identical drift in the frequencies of oscillations results in substantially zero drift in the output of mixer 14. The deviation introduced by control 13 however, is in opposite sense in the two oscillators 11, 12. Accordingly, the deviation difference obtained from mixer 14 is the sum of the individual deviations in oscillators 11, 12 introduced as a result of variation of capacitors 55, 65 by means of control 13. Accordingly, the output of mixer 14 has substantially better than crystal stability and a deviation which is substantially twice the normal deviation obtainable with an individual crystal controlled oscillator.

Referring now to FIG. 4 the frequency divider 22 will be described. The frequency divider 22 comprises a mixer tube 71, a multiplier tube 72 and a multiplier tube 73. The mixer 71 is shown as a multigrid tube of conventional type having two input grids 74, 75 with the grid 74 coupled to the one megacycle input signal derived from one megacycle oscillator 21. The output from the mixer 71 is derived from plate 76 which is connected to a plate load 77 comprising a parallel tuned circuit resonant at 0.1 mc. The signals on plate 76 are coupled to grid 78 of the multiplier tube 72 which produces output signals at plate 79 developed across a parallel tuned circuit 81 which is resonant 0.3 mc. signals. The plate 79 is coupled to a grid 82 of tube 73 and output signals appear at plate 83 which has as a plate load a double tuned transformer 84 which is tuned to 0.9 mc. The secondary of transformer 84 is connected by lead 85 to the input grid 75 of mixer tube 71. The operation of the multiplier 22 produces a 0.1 mc. signal output to multiplier 23 which is derived from plate 76 of tube 71 and coupled therefrom over lead 86.

In operation the multiplier 22 develops a 0.1 mc. signal from the one megacycle input signal on grid 74 as follows. The output frequencies appearing at plate 76 contain all of the sum and difference components of signals applied to the input grids 74 and 75. In the absence of a signal on grid 75 noise components and random fluctuations in the circuit will provide frequency components over a wide spectrum. Accordingly, the circuit from the plate electrode 76 through the tripler tube 72 and the second tripler 73 back to the grid 75 of tube 71 constitutes a high gain closed loop circuit which offers selective amplification of a signal of predetermined frequency. As previously stated, the random signals present in the tube 71 combine with the one megacycle input in grid 74 to produce beat frequencies. Assuming that a 0.9 mc. signal is present in the tube 71, the non-linear mixing action of the tube with the one megacycle input in grid 74 will produce a 0.1 mc. component at the plate 76. This component will find selective amplification as a 0.3 mc. output signal at the plate 79 of tube 72 since the plate load 81 is tuned to 0.3 mc. This selectively amplified frequency component will be multiplied in tube 73 to produce a 0.9 mc. signal at the output of transformer 84 which is tuned to 0.9 mc. Accordingly if a frequency spectrum including a 0.9 mc. component were present initially, the selective amplification and multiplication of signals through the closed loop back to grid 75 would produce a 0.9 mc. signal at grid 75. It has been found in practice that with the circuit shown the gain around the closed loop is sufficiently high that a 100 megacycle output signal appears at the plate 76 without any 0.9 mc. signal being externally introduced or other transient required to initiate the operation of the frequency divider 22. Accordingly a 0.1 mc. signal which is phase stable with respect to the one megacycle signal from oscillator 21 is obtained at the output lead 86. This form of multiplication is insensitive to the load on the subsequent harmonic amplifier 23 and does not exhibit the jitter associated with multivibrator divider circuits.

The remaining component circuits which are required for performing the functions disclosed in connection with FIG. 1 may comprise any of the well known prior art circuits as will be apparent to those skilled in the art and accordingly will not be further described herein.

Many modifications of the present disclosure and specific circuit will be apparent in the light of the present teaching and are to be considered as within the scope of the invention as defined in the appended claims.

I claim:

1. A frequency synthesizer comprising a highly stable fixed frequency source, means for dividing the frequency from said source to obtain a quotient frequency, a first harmonic generator for generating harmonics of said quotient frequency, a first tunable oscillator, a first mixer means coupling said first oscillator and said first harmonic generator to said first mixer, first selective means for tuning said first oscillator and selecting one of said harmonics to produce a constant beat frequency in said mixer for any setting of said selective means, a tuned amplifier coupled to said mixer for amplifying said constant beat frequency, a second harmonic generator for generating a group of harmonics of the frequency of said source, a second tunable oscillator, a second mixer, means coupling said second tunable oscillator and said second harmonic generator to said second mixer, second selective means for tuning said second oscillator to a set of frequencies, a band pass amplifier for selecting a fixed beat frequency from said second mixer for any selected frequency of said set of frequencies, a third oscillation generator adjustable over a range of frequencies, a third mixer for heterodyning the frequency from said third generator with said constant beat frequency, a fourth mixer for heterodyning a selected band of frequencies from said third mixer and the frequency of said first oscillator, a fifth mixer for heterodyning a selected band of frequencies from said fourth mixer and said fixed beat frequency, a sixth mixer for heterodyning a selected band of frequencies from said fifth mixer and the frequency of said second oscillator, and means for selecting the output frequency from said sixth mixer over a band of output frequencies, said second oscillator, first oscillator and third oscillation generator being adjustable in steps with the steps differing in the order named by the factor of the radix of the designation of said output frequency and the heterodyning in said fourth and sixth mixers cancelling respectively the frequencies of said first and second oscillators as a term in the synthesis of said output frequency.

2. Apparatus according to claim 1 in which said third oscillation generator comprises a fourth oscillator tunable in steps differing by the factor of said radix from the steps of said first oscillator, a continuously tunable oscillator and means for heterodyning the frequencies from said fourth oscillator and said continuously tunable oscillator to produce the output frequencies of said third generator.

3. Apparatus according to claim 2 in which said continuously tunable oscillator comprises a pair of crystal stabilized oscillators, means for deviating the oscillating frequencies of said oscillators in opposite directions, means for heterodyning the deviated outputs of said oscillators, and means for selecting an output from said hetrodyning means which is continuously variable over a band determined by said deviations.

4. A frequency synthesizer comprising a first oscillator adjustable in one megacycle steps over a predetermined frequency band; a second oscillator adjustable in one-tenth megacycle decade steps; a third oscillator adjustable in one-hundredth megacycle decade steps; means for providing from said third oscillator a selected output; a constant frequency crystal controlled oscillator; a harmonic amplifier for producing one megacycle harmonics of said crystal oscillator; a first mixer for heterodyning the output of said first oscillator with said megacycle harmonics; a frequency divider for producing a one-tenth megacycle wave from said crystal oscillator, a harmonic amplifier coupled to said frequency divider for producing one-tenth megacycle harmonics; a second mixer for heterodyning the output of said second oscillator and said one-tenth megacycle harmonics; a third mixer for heterodyning said selected output from said third oscillator with a selected beat frequency from said second mixer; a fourth mixer for heterodyning a selected beat frequency from said third mixer with the frequency of said second oscillator; a fifth mixer for hetrodyning a selected beat frequency from said fourth mixer with a selected beat frequency from said first mixer; a sixth mixer for heterodyning a selected beat frequency from said fifth mixer with the frequency of said first oscillator; and means for coupling selectable beat frequencies from the output of said sixth mixer, the heterodyning in said fourth and sixth mixers cancelling respectively the frequencies of said second and first oscillators as a term in the synthesis of said output frequency.

5. A frequency synthesizer comprising a first oscillator adjustable in one megacycle steps over a predetermined frequency band; a second oscillator adjustable in one-tenth megacycle decade steps; a third oscillator adjustable in one-hundredth megacycle decade steps; means for providing from said third oscillator a selected output; a constant frequency crystal controlled oscillator; a harmonic amplifier for producing one megacycle harmonics of said crystal oscillator; a first mixer for heterodyning the output of said first oscillator with said megacycle harmonics; a frequency divider having a beat frequency device, a first frequency tripler coupled to the output of said device, a second tripler coupled to the output of said first tripler, means coupling the output of said crystal oscillator and the output of said second tripler as the inputs to said device, and means for coupling a one-tenth megacycle wave from the output of said device as the output of said frequency divider; a harmonic amplifier coupled to said frequency divider for producing one-tenth megacycle harmonics; a second mixer for heterodyning the output of said second oscillator and said one-tenth megacycle harmonics; a third mixer for heterodyning said selected output from said third oscillator with a selected beat frequency from said second mixer; a fourth mixer for heterodyning a selected beat frequency from said third mixer with the frequency of said second oscillator; a fifth mixtr for heterodyning a selected beat frequency from said fourth mixer with a selected beat frequency from said first mixer; a sixth mixer for heterodyning a selected beat frequency from said fifth mixer with the frequency of said first oscillator; and means for coupling selectable beat frequencies from the output of said sixth mixer, the heterodyning in said fourth and sixth mixers cancelling respectively the frequencies of said second and first oscillators as a term in the synthesis of said output frequency.

6. A frequency synthesizer comprising a first oscillator adjustable in one megacycle steps over a predetermined frequency band; a second oscillator adjustable in one-tenth megacycle decade steps; a third oscillator adjustable in one-hundredth megacycle decade steps; fourth and fifth oscillators crystal stabilized with said crystals subject to common temperature control means, split stator variable capacitors connected to deviate the frequency of each of said fourth and fifth oscillators continuously over predetermined ranges, the rotors of said capacitors being ganged for simultaneous opposite capacitance variation, heterodyne means for beating the output frequencies of said fourth and fifth oscillators, means for selecting a beat frequency from said heterodyne means continuously variable over a frequency range equal to the sum of the deviations of said fourth and fifth oscillators, said sum being substantially equal to one-hundredth megacycle, means for heterodyning said continuously variable beat frequency with the frequency of said third oscillator to provide a selected output; a constant frequency crystal controlled oscillator; a harmonic amplifier for producing one megacycle harmonics of said crystal oscillator; a first mixer for heterodyning the output of said first oscillator with said megacycle harmonics; a frequency divider for producing a one-tenth megacycle wave from said crystal oscillator, a harmonic amplifier coupled to said frequency divider for producing one-tenth megacycle harmonics; a second mixer for heterodyning the output of said second oscillator and said one-tenth megacycle harmonics; a third mixer for heterodyning said selected output from said third oscillator with a selected beat frequency from said second mixer; a fourth mixer for heterodyning a selected beat frequency from said third mixer with the frequency of said second oscillator; a fifth mixer for heterodyning a selected beat frequency from said fourth mixer with a selected beat frequency from said first mixer; a sixth mixer for heterodyning a selected beat frequency from said fifth mixer with the frequency of said first oscillator; and means for coupling selectable beat frequencies from the output of said sixth mixer, the heterodyning in said fourth and sixth mixers cancelling respectively the frequencies of said second and first oscillators as a term in the synthesis of said output frequency.

7. A frequency synthesizer comprising a first oscillator adjustable in one megacycle steps over a predetermined frequency band; a second oscillator adjustable in one-tenth megacycle decade steps; a third oscillator adjustable in one-hundredth megacycle decade steps; fourth and fifth oscillators crystal stabilized with said crystals subject to common temperature control means, split stator variable capacitors connected to deviate the frequency of each of said fourth and fifth oscillators continuously over predetermined ranges, the rotors of said capacitors being ganged for simultaneous opposite capacitance variation, heterodyne means for beating the output frequencies of said fourth and fifth oscillators, means for selecting a beat frequency from said heterodyne means continuously variable over a frequency range equal to the sum of the deviations of said fourth and fifth oscillators, said sum being substantially equal to one-hundredth megacycle, means for heterodyning said continuously variable beat frequency with the frequency of said third oscillator to provide a selected output; a constant frequency crystal controlled oscillator; a harmonic amplifier for producing one megacycle harmonics of said crystal oscillator; a first mixer for heterodyning the output of said first oscillator with said megacycle harmonics; a frequency divider having a beat frequency device, a first frequency tripler coupled to the output of said device, a second tripler coupled to the output of said first tripler, means coupling the output of said crystal oscillator and the output of said second tripler as the inputs to said device, and means for coupling a one-tenth megacycle wave from the output of said device as the output of said frequency divider; a harmonic amplifier coupled to said frequency divider for producing one-tenth megacycle harmonics; a second mixer for heterodyning the output of said second oscillator and said one-tenth megacycle harmonics; a third mixer for heterodyning said selected output from said third oscillator with a selected beat frequency from said second mixer;

a fourth mixer for heterodyning a selected beat frequency from said third mixer with the frequency of said second oscillator; a fifth mixer for heterodyning a selected beat frequency from said fourth mixer with a selected beat frequency from said first mixer; a sixth mixer for heterodyning a selected beat frequency from said fifth mixer with the frequency of said first oscillator; and means for coupling selectable beat frequencies from the output of said sixth mixer, the heterodyning in said fourth and sixth mixers cancelling respectively the frequencies of said second and first oscillators as a term in the synthesis of said output frequency.

8. A frequency synthesizer comprising first and second stabilized oscillators continuously adjustable in frequency over predetermined ranges, means for selectively varying the frequencies of said oscillators in opposite direction, means for mixing said frequencies to produce a beat frequency continuously adjustable over a first decade range, a third stabilized oscillator adjustable in second decade steps each of which differs from adjacent steps by the amount of said first decade range, means for mixing the selected decade frequency of said third oscillator and the adjusted beat frequency of said first and second oscillators to produce a signal which is decade adjustable in two significant digits, a third stabilized oscillator, means for deriving from said third oscillator third decade steps of frequencies each of which differs from adjacent steps by the sum of said second decade steps, means for deriving from said third oscillator a plurality of step frequencies each differing from adjacent steps by the sum of said third decade steps, a first oscillator of nominal stability adjustable in decade steps equal to said second decade steps, a second oscillator of nominal stability adjustable in steps equal in number and size to said plurality of step frequencies, means for double heterodyning said first nominal stability oscillator with said third decade steps and said signal, means for heterodyning the result of said double heterodyning with said first nominal stability oscillator to produce a three significant digit adjustable signal, means for double heterodyning said second nominal stability oscillator with said plurality of step frequencies and said three significant digit signal, means for heterodyning the result of said last named double heterodyning with said plurality of step frequencies to produce an output signal adjustable in four significant digits, the second heterodyning with said first and second nominal stability oscillators in each instance cancelling the frequencies thereof as a term in said output signal.

References Cited in the file of this patent

UNITED STATES PATENTS

| | | |
|---|---|---|
| 1,830,322 | Hund | Nov. 3, 1931 |
| 2,240,452 | Wolfskill | Apr. 29, 1941 |
| 2,582,768 | Colas | Jan. 15, 1952 |
| 2,666,141 | Clapp et al. | Jan. 12, 1954 |
| 2,760,074 | Parzen | Aug. 21, 1956 |
| 2,777,064 | Robinson | Jan. 8, 1957 |